United States Patent
Draeger et al.

(10) Patent No.: US 8,058,179 B1
(45) Date of Patent: Nov. 15, 2011

(54) ATOMIC LAYER REMOVAL PROCESS WITH HIGHER ETCH AMOUNT

(75) Inventors: Nerissa Draeger, Fremont, CA (US); Harald te Nijenhuis, San Jose, CA (US); Henner Meinhold, Fremont, CA (US); Bart van Schravendijk, Sunnyvale, CA (US); Lakshmi Nittala, Sunnyvale, CA (US)

(73) Assignee: Novellus Systems, Inc., San Jose, CA (US)

( * ) Notice: Subject to any disclaimer, the term of this patent is extended or adjusted under 35 U.S.C. 154(b) by 386 days.

(21) Appl. No.: 12/343,102

(22) Filed: Dec. 23, 2008

(51) Int. Cl.
*H01L 21/302* (2006.01)

(52) U.S. Cl. ................ 438/714; 156/345.26

(58) Field of Classification Search .................. None
See application file for complete search history.

(56) References Cited

U.S. PATENT DOCUMENTS

| | | | |
|---|---|---|---|
| 4,414,069 A | 11/1983 | Cuomo | |
| 4,695,327 A | 9/1987 | Grebinski | |
| 4,756,794 A | 7/1988 | Yoder | |
| 5,030,319 A | 7/1991 | Nishino et al. | |
| 5,268,069 A | 12/1993 | Chapple-Sokol et al. | |
| 5,282,925 A * | 2/1994 | Jeng et al. | 216/59 |
| 5,474,641 A | 12/1995 | Otsuki et al. | |
| 5,505,816 A | 4/1996 | Barnes et al. | |
| 5,636,320 A | 6/1997 | Yu et al. | |
| 5,766,971 A | 6/1998 | Ahlgren et al. | |
| 5,792,275 A | 8/1998 | Natzle et al. | |
| 5,838,055 A | 11/1998 | Kleinhenz et al. | |
| 5,876,879 A | 3/1999 | Kleinhenz et al. | |
| 5,968,279 A | 10/1999 | Macleish et al. | |
| 5,976,973 A | 11/1999 | Ohira et al. | |
| 5,994,240 A | 11/1999 | Thakur | |
| 6,071,815 A | 6/2000 | Kleinhenz et al. | |
| 6,074,951 A | 6/2000 | Kleinhenz et al. | |
| 6,335,261 B1 * | 1/2002 | Natzle et al. | 438/435 |
| 6,573,181 B1 | 6/2003 | Srinivas et al. | |
| 6,652,713 B2 | 11/2003 | Brown et al. | |
| 6,706,334 B1 | 3/2004 | Kobayashi et al. | |
| 6,726,805 B2 | 4/2004 | Brown et al. | |
| 6,774,000 B2 * | 8/2004 | Natzle et al. | 438/300 |
| 6,776,874 B2 | 8/2004 | Kobayashi et al. | |
| 6,790,733 B1 | 9/2004 | Natzle et al. | |
| 6,803,309 B2 | 10/2004 | Chou et al. | |
| 6,817,776 B2 | 11/2004 | Colgan et al. | |
| 6,837,968 B2 | 1/2005 | Brown et al. | |

(Continued)

FOREIGN PATENT DOCUMENTS

WO 04/001809 12/2003

OTHER PUBLICATIONS

U.S. Appl. No. 60/905,782, filed Mar. 7, 2007, Liu et al.

(Continued)

*Primary Examiner* — Binh X Tran
*Assistant Examiner* — David Cathey, Jr.
(74) *Attorney, Agent, or Firm* — Weaver Austin Villeneuve & Sampson LLP (57) ABSTRACT

Higher overall etch rate and throughput for atomic layer removal (ALR) is achieved. The reaction is a self-limiting process, thus limiting the total amount of material that may be etched per cycle. By pumping down the process station between reacting operations, the reaction is partially "reset." A higher overall etch rate is achieved by a multiple exposure with pump down ALR process.

17 Claims, 8 Drawing Sheets

U.S. PATENT DOCUMENTS

| | | | |
|---|---|---|---|
| 6,852,584 | B1 | 2/2005 | Chen et al. |
| 6,858,532 | B2 | 2/2005 | Natzle et al. |
| 6,905,965 | B2 | 6/2005 | Subrahmanyan et al. |
| 6,926,843 | B2 | 8/2005 | Cantell et al. |
| 6,951,821 | B2 | 10/2005 | Hamelin et al. |
| 6,967,167 | B2 | 11/2005 | Geiss et al. |
| 6,992,011 | B2 | 1/2006 | Nemoto et al. |
| 7,029,536 | B2 | 4/2006 | Hamelin et al. |
| 7,079,760 | B2 | 7/2006 | Hamelin et al. |
| 7,416,989 | B1 * | 8/2008 | Liu et al. ............ 438/706 |
| 2001/0016226 | A1 | 8/2001 | Natzle et al. |
| 2002/0106908 | A1 | 8/2002 | Cohen et al. |
| 2003/0029568 | A1 | 2/2003 | Brown et al. |
| 2003/0134038 | A1 | 7/2003 | Paranjpe |
| 2004/0018740 | A1 | 1/2004 | Brown et al. |
| 2004/0083977 | A1 | 5/2004 | Brown et al. |
| 2004/0110354 | A1 * | 6/2004 | Natzle et al. ............ 438/365 |
| 2004/0182324 | A1 | 9/2004 | Wallace et al. |
| 2004/0184792 | A1 | 9/2004 | Hamelin et al. |
| 2004/0185670 | A1 | 9/2004 | Hamelin et al. |
| 2004/0200244 | A1 | 10/2004 | Hung et al. |
| 2005/0056370 | A1 | 3/2005 | Brown et al. |
| 2005/0101130 | A1 | 5/2005 | Lopatin et al. |
| 2005/0106877 | A1 | 5/2005 | Elers et al. |
| 2005/0205110 | A1 | 9/2005 | Kao et al. |
| 2005/0218113 | A1 | 10/2005 | Yue |
| 2005/0218507 | A1 | 10/2005 | Kao et al. |
| 2005/0221552 | A1 | 10/2005 | Kao et al. |
| 2005/0230350 | A1 | 10/2005 | Kao et al. |
| 2005/0266684 | A1 | 12/2005 | Lee et al. |
| 2005/0270895 | A1 | 12/2005 | Strang |
| 2006/0051966 | A1 | 3/2006 | Or et al. |

OTHER PUBLICATIONS

U.S. Appl. No. 60/925,255, filed Apr. 18, 2007, Schravendijk et al.

U.S. Appl. No. 60/962,638, filed Jul. 30, 2007, Liu et al.

U.S. Appl. No. 12/002,085, filed Dec. 13, 2007, Liu et al.

U.S. Appl. No. 12/002,171, filed Dec. 14, 2007, Schravendijk et al.

U.S. Office Action mailed Dec. 5, 2007 from U.S. Appl. No. 11/479,812.

U.S. Office Action mailed Jul. 17, 2007 from U.S. Appl. No. 11/479,812.

U.S. Office Action mailed May 2, 2007 from U.S. Appl. No. 11/479,812.

T. Meguro et al., "Digital etching of GaAs: New approach of dry etching to atomic ordered processing", Apr. 16, 1990, American Institute of Physics pp. 1552-1554.

S.D. Park et al. "Atomic Layer Etching of Si(100) and Si(111) Using Cl2 and Ar Neutral Beam", Electrochemical and Solid-State Letters, 8 (8) C106-C109 (2005).

H. Ogawa et al., "Dry Cleaning Technology for Removal of Silicon Native Oxide Employing Hot NH3/NF3 Exposure", The Japan Society of Applied Physics, Part I, No. 8, Aug. 2002, pp. 5349-5358.

H. Nishino et al., "Damage-free selective etching of Si native oxides using NH3/NF3 and SF6/H2O down-flow etching", J. Appl. Phys. vol. 74, No. 2, Jul. 15, 1993, pp. 1345-1348.

Y. Yang et al., "Ultrahigh-selectivity silicon nitride etch process using an inductively coupled plasma source", J. Vac. Sci. Technol. A, vol. 16, No. 3, May/Jun. 1998, pp. 1582-1587.

Phan et al., Integrated Clean Process Using NF3/NH3 Remote Plasma for Nickle Silicide Formation, SEMICON Korea STS 2006, pp. 159-163.

S. Athavale et al., Molecular dynamics simulation of atomic layer etching of silicon, J. Vac. Sci. Technol. A, vol. 13, No. 3, May/Jun. 1995, pp. 966-971.

W. Natzle et al., "Trimming of hard-masks by Gaseous Chemical Oxide Removal (COR) for Sub-10nm Gates/Fins, for Gate Length Control and for Embedded Logic", 2004 IEEE/SEMI Advanced Semiconductor Manufacturing Conference, pp. 61-65.

Honda et al., "Chemical Dry Cleaning Technology for Reliable 65nm CMOS contact to $NiSi_x$", IITC-2005 paper9.4.

Okamura et al., "Low Damage Via Formation with Low Resistance by NH3 Thermal Reduction for Cu / Ultra Low-k Interconnects", 2004 IEEE, pp. 42-44.

Kim, et al., "New Contact Cleaning in HF & N2/H2 Microwave Plasma", Solid State Phenomena vol. 92, (2003), pp. 239-242.

Byun et al., The Effects of Reactive Precleaning (RPC+) on the Formation of Titanium Silicide by PECVD $TiCl_4$-Ti Deposition, and Its Thermal Stability, 2001, IEEE, pp. 222-224.

Taguwa, et al., "ICP-Ar/$H_2$ Precleaning and Plasma Damage-Free Ti-PECVD for Sub-Quarter Micron Contact of Logic with Embedded DRAM", Conference Proceedings USLI XV 2000, pp. 589-593.

Chang, et al., "Interface Characteristics of Selective Tungsten on Silicon Using a New Pretreatment Technology for ULSI Application", 1997 IEEE, pp. 738-743.

Park et al., "Low Damage In Situ Contact Cleaning Method by a Highly Dense and Directional ECR Plasma," Jpn J. Appl. Phys. vol. 35 (1996), pp. 1097-1101.

* cited by examiner

Isolated features

Dense Arrays

ATOMIC LAYER REMOVAL PROCESS WITH HIGHER ETCH AMOUNT

FIELD OF THE INVENTION

This invention relates to electronic device fabrication processes and associated apparatus. More specifically, it relates to dry etch processes for removing dielectric films.

BACKGROUND OF THE INVENTION

It is often necessary in semiconductor processing to remove or etch dielectric films from a substrate surface. Various etching processes are available to etch different materials and geometries at different rates. Considerations for choosing the appropriate etch process include etch rates, selectivity to other materials, by-products, and ability to finely control the process. Regarding etch rates, rates for the material to be removed and rates for the material to remain at various geometries may be considered. Some etch processes are isotropic, etching evenly at all surfaces. Others are anisotropic. A higher etch rate is usually preferred, accompanied by a lower etch rate for the material intended to remain. This etch selectivity may be based on material properties and chemistry or geometries, e.g., whether the material is located on a sidewall or a field region. Sometimes compounds generated by the etch process, e.g., in some plasma etching processes, can redeposit and in some cases cause integration issues. Thus the by-product of the etching process and its removal from the processing area may be considered. For etching thin films or specific geometries, the ability to finely control the amount etched is an important consideration.

An etch process may be a step in a deposition process, such as in gap fill of shallow trench isolation (STI), inter-layer dielectric (ILD), inter-metal dielectric (IMD), and pre-metal dielectric (PMD) features. High aspect ratio features of narrow width are filled by depositing material into the bottom of the feature while removing, in an etch-back process, deposited material in areas that may obstruct further bottom deposition.

As film thickness and feature sizes continue to shrink, improvements in etch and etch-back processes to increase etch rate, selectivity, and reduce by-product issues, while maintaining excellent process control continue to be sought.

SUMMARY OF THE INVENTION

Atomic layer removal (ALR) etch is a process that offers excellent process control. In ALR, a film material is reacted to form a solid reaction product having a greater specific volume than the film material it consumes. The solid reaction product is sublimated and removed. The reaction is self-saturating, thus limiting the amount of material that may be etched per cycle. Multiple cycles may be required to etch a desired amount of material. Overall etch rate and throughput for an ALR etch process is increased by pumping down the process station between reacting operations. Pumping down the process station partially "resets" the saturation and allows another reacting operation before the solid reaction product is removed. The result is a higher overall etch rate per cycle.

The present invention pertains to methods of etching a film on a substrate using an ALR process. The method includes providing the substrate in a processing station, reacting a portion of the film with one or more reactants, repeating as desired, pumping the processing station to a reduced pressure, reacting again with one or more reactants, and then removing the solid reaction product. The processing station includes a substrate holder on which one or more substrates is placed during processing and encloses a processing area in which pressure, temperature, gas flows, and other processing conditions may be independently controlled from that of other processing stations. The enclosure may be solid or not, e.g., walls or gas curtains. The process may be performed on one or more processing stations. In one embodiment, the reacting and pumping steps could be performed on a first processing station while the removing step is performed on a second processing station. During the reacting operation, one or more reactants, in gaseous form, are injected into the processing area to react with the film on the substrate. After the reaction progresses to a certain extent, the processing station is pumped to a reduced pressure, which is less than the pressure during the reacting operation. The pumping operation partially resets the reaction to allow for further reacting. Then an additional portion of the film is reacted to form an additional solid reaction product before the solid reaction product is removed by sublimating at an elevated temperature. The method may include multiple cycles of pumping and reacting operations to remove even more material at a high overall etch rate. The method may also include multiple cycles of reacting, pumping reacting and removing operations.

The reactants comprise a fluorine source and a nitrogen source. The fluorine source may include hydrogen fluoride (HF), fluorine ($F_2$), nitrogen trifluoride ($NF_3$), atomic fluorine ($F^*$), ammonium fluoride ($NH_4F$), and ammonium bifluoride ($NH_4F{:}HF$) or other compounds from which fluorine may be generated in-situ. The nitrogen source may include ammonia ($NH_3$), atomic nitrogen ($N^*$), or other compounds from which nitrogen may be generated in-situ. In certain embodiments, reactants hydrogen fluoride (HF) and ammonia ($NH_3$) are flowed continuously to the processing station during the reacting operation, at a particular ratio, e.g., about 2 to 1. The reacting partial pressure for the reactant gas may be about 1 mTorr to about 1 Torr or about 1 mTorr to about 100 mTorr or about 3 mTorr to 30 mTorr. The overall processing station pressure may be much higher if diluents, e.g., inert gas or carrier gas, are used. An inert gas such as nitrogen, argon or helium may be added in addition to the reactant gases. The reacting operation takes place at about room temperature, about 20 to 30 degrees Celsius. The processing station pressure for the first and second reacting operation may be the same or different. A purge gas may also be used during the pumping or removing operations. In other embodiments, the reactant gases may be injected sequentially in either order or with some overlap.

In the pumping operation, the processing station pressure may be reduced by reducing gas flow or by increasing a pump power, for example, a turbo pump. The reduced pressure may be between about 0.01 mTorr and about 100 mTorr, less than about 50 mTorr, preferably less than 6 mTorr. This reduced pressure may be maintained for a period of between about 1 second and about 60 seconds, or between about 5 second and about 30 seconds. Increased duration at reduced pressure is found to increase the effectiveness of the "reset," up to a point. However, the increase in effectiveness of the "reset" is offset by the increase in total process time—increased duration at reduced pressure may decrease overall etch rate and throughput by increasing total process time. In certain embodiments, the reduced pressure duration at about 30 seconds yields an effective "reset" that provides increased etch rate and thus improved throughput. Overall, etch rate and throughput gain occur when the reduced pressure duration is less than or equal to the duration of the removing (sublimating) operation. During the reduced pressure operation, an inert purge gas may be flowed into the processing station. In certain cases, it may be desirable to use heated gas(es) for the purge step to encourage partial sublimation of the solid reaction product.

In the removing operation, the substrate is heated to an elevated temperature, e.g., about 100° C. or above. At this temperature the solid reaction product sublimates and is removed from the processing area by gas purging and/or pumping. If another reacting operation is to be performed following the sublimation, the substrate is cooled to a temperature suitable for the reacting operation, e.g., about room temperature. In other words, in the subsequent reacting operation the substrate temperature should not be so hot that the solid reaction product does not form.

By applying the multiple exposure with pump down ALR process as disclosed, the reaction time to etch about 100 Å of a silicon oxide material may be reduced or improved by at least about 15% from the single cycle ALR process. In other words, the react-pump-react-sublimate may be at least 15% faster than react-sublimate. This process may also be at least 10% faster than a multiple cycle ALR process, where reacting and sublimating are repeated without a pumping operation. In other words, the react-pump-react-sublimate may be at least 10% faster than react-sublimate-react-sublimate.

In another aspect, the present invention pertains to a gap filling process. This process may be used in filling of shallow trench isolation (STI), inter-layer dielectric (ILD), inter-metal dielectric (IMD), or pre-metal dielectric (PMD) features. The gap fill method includes depositing a fill material in a gap and on the surface of a substrate; reacting a portion of the film with one or more reactants to form a solid reaction product, pumping the processing station to a reduced pressure, reacting again with one or more reactants, removing the solid reaction product, and repeating the depositing operation to fill the feature. The solid reaction product in an ALR process has a greater specific volume than the fill material it consumes. Thus for certain gap geometries, the solid reaction product formed from the material consumed on a circumferential sidewall may block reactants from reaching the bottom of a gap to etch material there. Thus, the fill material at the bottom of the feature may be substantially protected from the reacting operations, leading to more efficient gap fill.

In certain embodiments, not enough material is removed in one react-pump-react cycle, and additional pump-react operations may be repeated to increase the total etch depth. In other embodiments, a deposition and ALR etch cycle may be repeated, including the first depositing operation, the first reacting operation, the pumping operation, the second reacting operation, and the removing operation. In still other embodiments, only the etch operations are repeated, including the first reacting operation, the pumping operation, the second pumping operation, and the removing operation. Thus one skilled in the art may adapt a process sequence given a particular geometry using the increased etch rate process disclosed herein.

In yet another aspect, the present invention pertains to a semiconductor processing apparatus configured for performing the disclosed ALR process. In certain embodiments, the semiconductor processing apparatus includes at least a chamber and a controller. The chamber includes one or more processing stations which may contain one or more substrates. In one embodiment, the reacting, pumping and removing operations are performed at a single processing station. In another embodiment, the reacting and pumping operations are performed at a first processing station while the removing operation is performed at a second processing station. In yet another embodiment, there may be four processing stations on which two cycles of react-pump-react and removal are performed sequentially, e.g., the first processing station performs a react-pump-react operation, the second processing station performs a removing operation, the third processing station performs another react-pump-react operation, and the fourth processing station performs another removing operation.

The processing stations usually include a temperature-controlled substrate holder configured to heat and cool a substrate, one or more reactant gas injectors, and a connection to a vacuum source. The controller may be configured to execute a set of instructions to perform the ALR etch process. The set of instructions may include injecting one or more reactant gases into the processing station at a first reaction pressure for a first reaction duration; reducing station pressure to below that of the first reaction pressure for a pump-down duration; injection one or more reactant gases into the processing station at a second reaction pressure for a second reaction duration; and heating the substrate to a sublimation temperature for a removing duration. In certain embodiments, the set of instructions may include moving the substrate from a first processing station to another processing station. The set of instructions may also include cooling the substrate subsequent to the removing (heating) operation. These and other features and advantages of the invention will be described in more detail below with reference to the associated drawings.

DETAILED DESCRIPTION OF THE PRESENT INVENTION

Introduction

Embodiments of the present invention are described herein in the context of etching a substrate with blanket dielectric film and the context of filling a gap with dielectric material. Those of ordinary skill in the art will realize that the following detailed description of the present invention is illustrative only and is not intended to be in any way limiting. Other embodiments of the present invention will readily suggest themselves to such skilled persons having the benefit of this disclosure. For example, the gap fill application may be for shallow trench isolation (STI), inter-layer dielectric (ILD), inter-metal dielectric (IMD), or pre-metal dielectric (PMD).

Reference will be made in detail to implementations of the present invention as illustrated in the accompanying drawings. The same reference indicators will be used throughout the drawings and the following detailed description to refer to the same or like parts. In this application, the terms "work piece," "wafer" and "substrate" will be used interchangeably. The following detailed description assumes the invention is implemented on a wafer. However, the invention is not so limited. The work piece may be of various shapes, sizes, and materials (e.g., displays of various sizes).

The invention relates to methods to increase overall ALR etch rates and therefore throughput. Suitable ALR methods are disclosed in U.S. Pat. No. 6,335,261, "Directional CVD Process with Optimized Etchback" by Natzle et al., the relevant disclosure of which is incorporated herein by reference. It describes an optimized chemical oxide removal (COR) process in which a dielectric material is reacted to form a solid reaction product having a greater specific volume than the material it consumes. The process includes two main steps: a reacting step and a by-product removing step. In the reacting step, one or more reactants are injected into a process station containing a substrate to react with the film thereon. Other ALR methods are disclosed in U.S. patent application Ser. No. 12/002,171, 12/122,614, and 12/144,518, the disclosures of which are herein incorporated by reference in their entireties.

In some embodiments, the gaseous reactants are ammonia ($NH_3$) and anhydrous hydrogen fluoride (HF), in the proportion of approximately two parts ammonia to three parts hydrogen fluoride. The reaction may be the following:

$2NH_3 + 3HF \rightarrow NH_4F + NH_4F \cdot HF$ $NH_4F + NH_4F \cdot HF + SiO_2 \rightarrow (NH_4)_2SiF_6 \text{ (solid)} + H_2O$ The solid reaction product is believed to be ammonium hexafluorosilicate.

In still other embodiments, the reactants may include hydrogen ($H_2$), atomic hydrogen (H*), fluorine (F2), atomic fluorine (F*), atomic nitrogen (N*), nitrogen trifluoride ($NF_3$), $NH_4F$, and $NH_4F$:HF. Ammonium fluoride ($NH_4F$) or ammonium bifluoride ($NH_4F \cdot HF$) may be directly introduced into the chamber, instead of being formed from ammonia and hydrogen fluoride, or other reactants, e.g., ammonia ($NH_3$), hydrogen fluoride (HF), hydrogen ($H_2$), nitrogen trifluoride ($NF_3$), nitrogen ($N_2$), and water vapor ($H_2O$). In certain embodiments, atomic hydrogen, atomic fluorine, and/or atomic nitrogen may be generated ex-situ and introduced into the chamber. For example, a nitrogen plasma generated remotely may be introduced into the chamber.

Figure 1A:
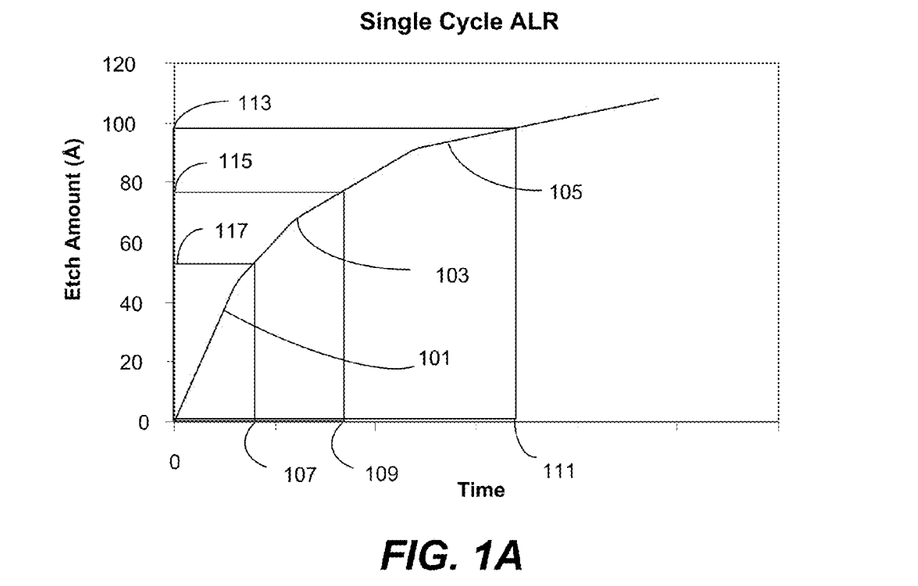
FIG. 1A is a plot of thickness etched over time in a single cycle atomic layer removal process.
Figure 1B:
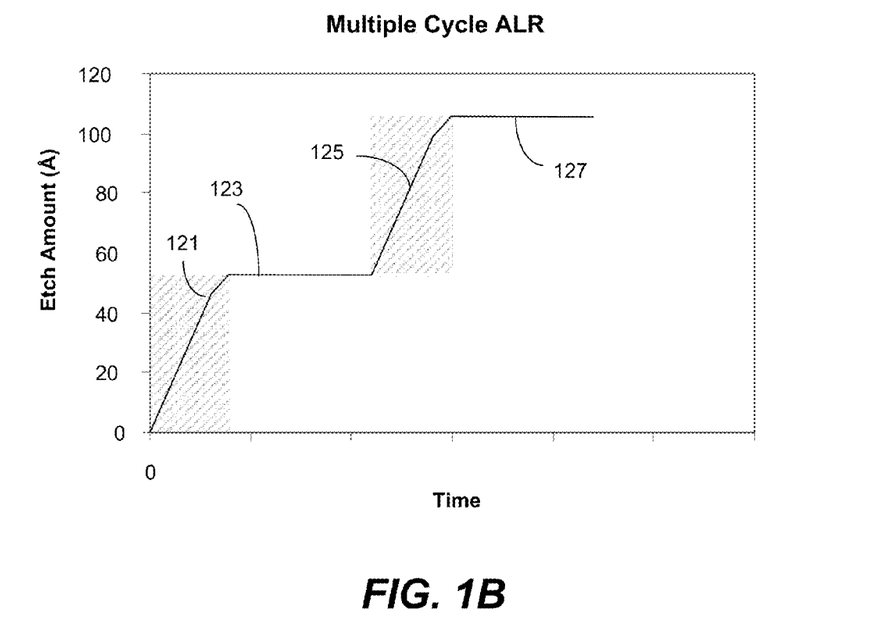
FIG. 1B is a plot of thickness etched over time in a multiple cycle atomic layer removal process.

FIG. 1A shows the relationship between etch amount in Ångströms over reaction time for a single cycle ALR. The single cycle ALR includes only one reacting operation and one sublimating operation. FIGS. 1A and 1B show reacting time, which does not include a sublimating time that is a part of every single cycle ALR. A slope of the curve represents an etch rate during the reaction. Three sections of the etch amount over time curve are shown. In the first section 101, the etch rate is highest. This corresponds to the initial reaction of the reactants with the dielectric material. The etch rate reduces over time, as shown in curve section 103, as more material is reacted. The etch rate decreases even further in curve section 105. This reduction in the amount etched is shown by comparing the amount etched at various times. Time 109 is about two times longer than time 107; and, time 111, about two times longer than 109. However, the amount etched increases only disproportionately. Comparing the amount etched at time 111 to that of time 107, the amount etched did not even double with when the etch is four times longer. After section 105, the slope of the curve continues to decrease and eventually flattens out as the reaction saturates. It is believed that as the ammonium hexafluorosilicate and other reaction by-product builds up, the transport of new reactant to the film material interface slows or stops. Thus only a certain amount of film material may be etched in one cycle.

Because single cycle ALR becomes more inefficient as the etch amount increases, ALR reactions are preferably conducted in the curve 101 or 103 regime. To etch a thicker film, multiple cycles of ALR are used, as shown in FIG. 1B.

In FIG. 1B, two cycles of ALR are shown. Each cycle includes a reacting operation (121 and 125) and a sublimating operation (123 and 127). The curve for the reacting operation is the same as that of section 101 of FIG. 1A.

In the sublimating operation 123 and 127, after a desired amount of dielectric material has been reacted, the solid reaction product may be removed by decomposition and evacuation or purging. It is believed that the solid reaction product, ammonium hexafluorosilicate, will decompose and sublimate at temperature of greater than about 100° C., preferably 100-150° C. The decomposition and sublimation reaction may be as follows:

$(NH_4)_2SiF_6 \rightarrow SiF_4\uparrow + NH_3\uparrow + 2HF\uparrow$

The decomposition products of $SiF_4$, $NH_3$, and HF are all gases that can be readily evacuated or purged. The removal may be accomplished by one or more vacuum sources coupled to the chamber or station, with or without an inert purge gas.

In FIG. 1B, the etch depth (thickness of material removed) stays constant during the sublimating operation 123 and 127 because the residual film under the solid reaction product is not affected by the sublimation process. After the solid reaction product is removed, the film is reacted again in operation 125. Because the solid reaction product is removed, the etch process begins anew and curve 125 mirrors the beginning portion of the single cycle ALR in FIG. 1A. The amount etched by multiple cycle ALR equals the amount etched in single cycle ALR times the number of cycles (for the same process time and conditions). Because of the saturation behavior of the etch rate with increasing etch time, the multiple cycle ALR can also etch more material in less time than a single cycle ALR for high material removal amounts.

The multiple cycle ALR as depicted in FIG. 1B removes all of the solid reaction product in the sublimation process, allowing the etch process to begin anew. The sublimation operation usually occurs in a different processing area, which may require the wafer to be moved or transferred to a different processing station. The sublimation may also require a wafer temperature increase and subsequent temperature decrease in order to perform an additional reaction process. These operations add time to the total process time and affect the throughput gain from the increased etch rate with multiple-cycle ALR.

A method to increase the overall etch rate even further is unexpectedly found by an inventive method of resetting the etch reaction rate by reducing the pressure, or pumping down the processing station. A reduction in pressure, with or without purge gas, from that of the reaction operation can partially or completely reset the reaction rate so that a sublimation operation is not required between ALR reaction operations. Thus, even though the solid reaction product is not substantially removed, the second reaction operation can start again in a higher etch rate regime than it was in at the end of the initial reaction operation. The second reaction operation is then followed by a sublimation reaction.

Figure 1C:
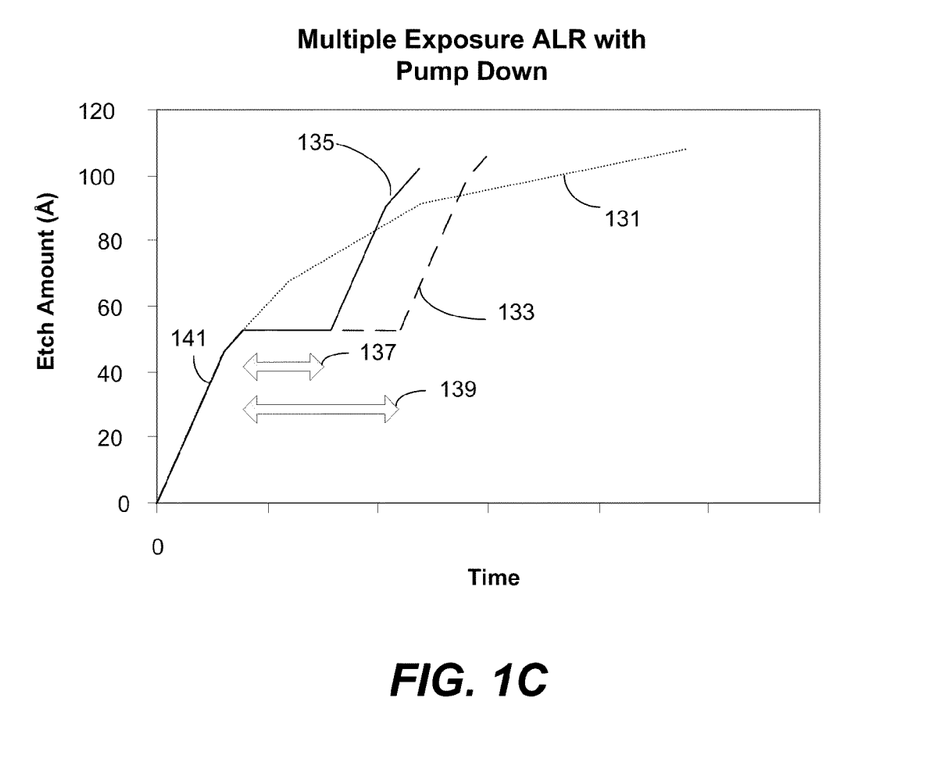
FIG. 1C is a plot of thickness etched over time in a multiple exposure ALR with pump down process in accordance with various embodiments of the present invention.

FIG. 1C depicts these methods: single cycle ALR, multiple cycle ALR, and multiple exposure ALR with pump down. At time 0 all three of these methods follow the initial curve section 141. As reactions proceed, reactants are introduced to the film material. The reaction continues for the single cycle ALR following curve 131 (dotted lines) and saturates after some time. Multiple cycle ALR is also shown on FIG. 1C, as curve 133 (dashed lines).

Multiple-exposure ALR with pump down is shown as curve 135 (solid line). Just as with the multiple-cycle ALR, the initial reaction 141 is followed by a period of no reaction, of a duration 137. During this time the pressure is reduced in the processing area as compared to the reaction operation pressure. The pressure reduction may occur by pumping down the station or reaction area. This pumping down may occur with or without introducing a purge gas, such as nitrogen. Importantly, this pumping down may occur without moving the wafer to another processing area and without changing the wafer temperature.

The pressure reduction partially or completely resets the etch reaction rate, having a similar effect as a sublimation operation without substantially removing the solid reaction product. The wafer is then exposed again to the reactants that continue to etch the film.

A comparison of the three curves shows that for different desired etch depths, different ALR methods may be used to achieve the fastest overall etch. For small etch amounts, the single cycle ALR is more effective. The gain from being in a high etch rate regime for a multiple cycle or multiple exposure with pump down methods may not offset the time to pump down or to sublimate the solid reaction product. As higher etch amounts, a multiple exposure with pump down method becomes the more attractive method. Note the difference in duration between the pump down period (137) and sublimation period (139). Of course, the end point of the first reaction operation curve 141 may be adjusted as the process requires if more or less total material is to be etched. One skilled in the art would be able to utilize the concepts disclosed herein to devise a process sequence with the best overall etch rate.

Figure 2:
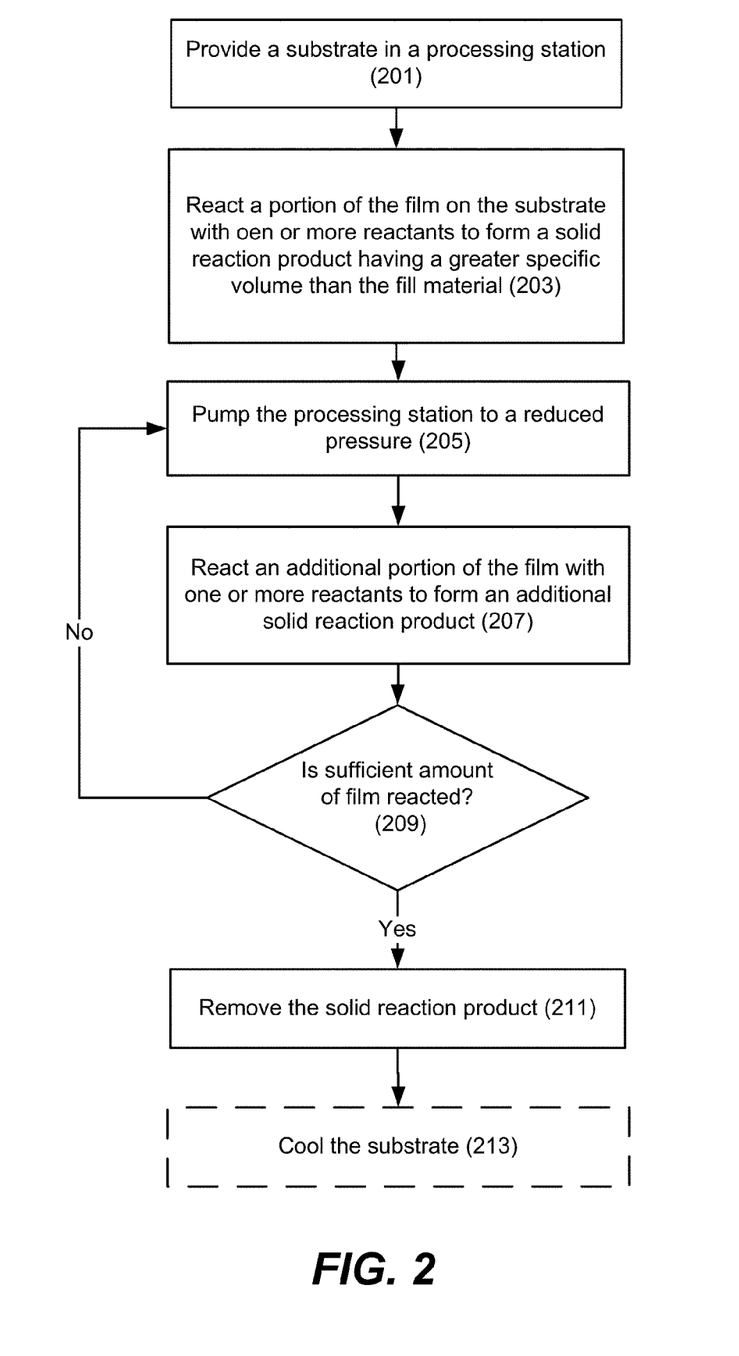
FIG. 2 is a process flow diagram depicting the operations for a multiple exposure with pump down ALR process in accordance with various embodiments of the present invention.

The process flow of a multiple exposure with pump down ALR method is depicted in FIG. 2. In operation 201, a substrate is provided in a processing station. A processing station may be a part of a multiple station processing chamber or a stand-alone single-station chamber. Generally, one or more processing conditions in a processing station are independently controllable from other processing stations that may share the same chamber. For example, independently controllable conditions may include gas flows, pressure, station temperature, and wafer temperature.

The substrate includes dielectric film deposited thereon. In operation 203, a portion of the film on the substrate is reacted with one or more reactants to form a solid reaction product having a greater specific volume than the fill material it consumes. The chemical reactions in this operation are described above. During the reaction operation, the reactant gases may be flowed into the processing station sequentially in either order or concurrently. The reactant gases may be added in a dose or in a continuous stream. In some embodiments, a first reactant gas is added, and while the first reactant gas continues to flow, a second reactant gas is added.

In some embodiments, the reactant gases are flowed into the processing area at a ratio between about 1 part HF to 1 part $NH_3$ to about 3 parts HF to 1 part $NH_3$, preferably about 2 parts HF to 1 part $NH_3$. The partial pressure of the reactant gas may be about 1 mTorr to 1 Torr or about 1 mTorr to 100 mTorr, preferably about 3 mTorr to 30 mTorr. In certain embodiments, an inert gas, such as nitrogen, argon or helium, is added. The HF flow rate may be between about 10 to 200 sccm. The $NH_3$ flow rate may be between about 10 to 200 sccm. The inert gas flow rate may be between 0 sccm to about 400 sccm. Depending on the inert gas flow, the total station pressure may be much higher than the reactant gas partial pressure.

The etch reaction rate has a slight dependence on reactant partial pressures. However, if the reactant or by-product partial pressures are too high for a given processing temperature, they can condense on the surface of the wafer causing irregular etching. Irregular etching could damage the partially fabricated semiconductor devices on the wafer and reduce yield and should be avoided. Therefore, the wafer temperature and reactant partial pressures are controlled to yield processing conditions at which condensation does not occur. In certain embodiments, the wafer temperature may be between about 20 to 30° C. Furthermore, the processing station temperature may also be temperature controlled to avoid condensation on chamber materials. The processing station temperature is typically higher than the wafer temperature during the etch process, between about 30 to 90° C.

In operation 205, the pressure in the processing station is reduced for a time. As discussed above, this pressure reduction effectively "resets" the etch reaction rate without a separate sublimation operation. The pressure may be reduced to about 0.01 to 100 mTorr, depending on the initial etch reaction pressure. The pressure reduction may occur without a change in wafer temperature or moving the wafer from one processing area to another. The pump down period may be about 1 to 30 seconds or longer. As discussed above, a longer pump down period would reduce the overall etch rate gain. Thus the pump down period is preferably as short as possible while allowing the reaction rate to reset. Purge gas may be flowed during the pump down and in certain situations it may be desirable to use heated gas to encourage partial sublimation of the solid reaction product.

Figure 3:
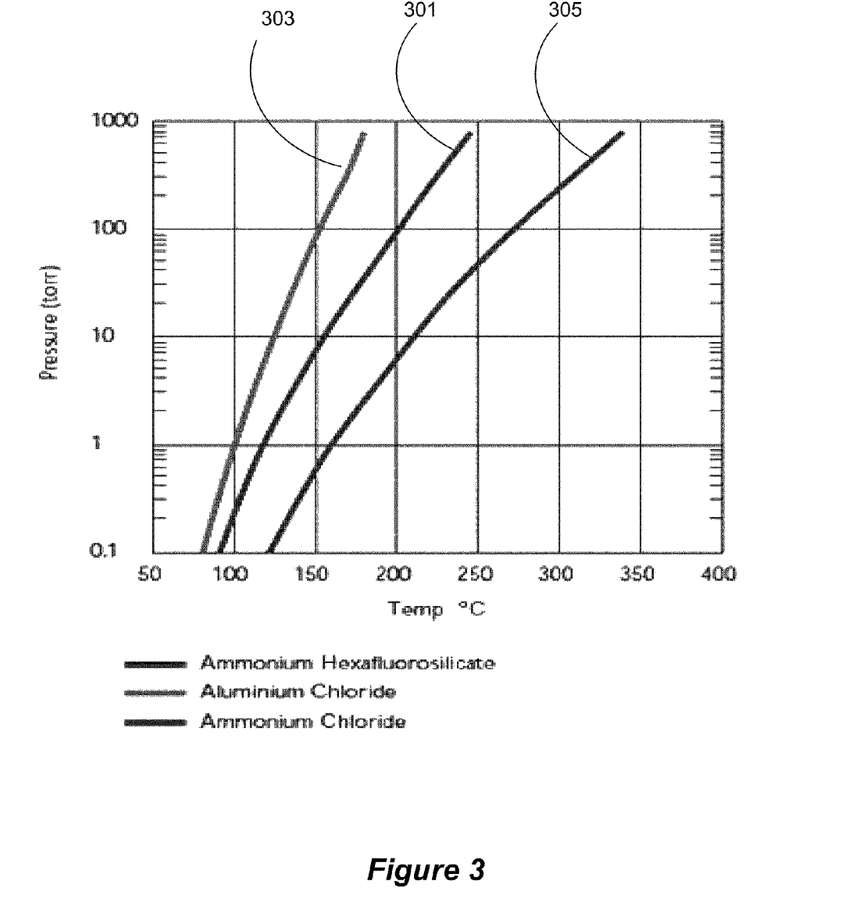
FIG. 3 is a vapor pressure curve for ammonium hexafluorosilicate and other gases.

Though not intending to be bound by these theories, one or more mechanisms may explain the gain in etch reaction rate resulting from the pump down. One mechanism involves a partial sublimation of the AHFS etch product during the pumping operation due to the difference in by-product partial pressure at the surface and in the processing station. FIG. 3 is the vapor pressure curve for three gases include ammonium hexafluorosilicate (AHFS) (line 301), and other gases aluminum chloride and ammonium chloride. (Product Data Sheet, Temperature Management System, Publication No: Y014-00-895, BOC Edwards 2001, available from http:/www.bocedwards.com) Although the wafer temperature during the pump down is only about room temperature, the pressure during the pumping operation may be lower than about 6 mTorr and a small amount of sublimation may occur. The small amount of sublimation reduces the total AHFS that can block diffusion of fresh reactant gases to the unreacted fill material.

Another theory involves removal of reaction by-products other than AHFS by the pump down operation. The diffusion of reaction by-products, such as water, away from the fill material interface may be slower than the diffusion of reactants to the interface or than the etch reaction itself. The build-up in the AHFS film of these by-products may contribute to the saturation behavior of the process. Stopping the process and lowering the pressure in the processing station aids their removal. A related theory involves the accumulation of water during the reaction in other chamber areas. The other chamber areas may act as a getter of water that affects the amount of reactant gases that are transported to the fill material interface. Removing the water by reducing process station pressure reduces any effect of the water or other by-products on the reaction at the fill material interface.

Referring back to FIG. 2, a reaction operation similar to operation 203 is disclosed in operation 207. Additional portions of the film are reacted to form additional solid reaction products. One or more reactant gases are re-introduced in the processing area to effect operation 207. This reaction operation 207 need not occur at the same partial pressure or reactant gas flow or temperature as the first reaction operation 203. More or less reaction may occur at a higher or lower pressure, flow rate and temperature. However, in order to maximize overall etch rate, it is preferred to etch at the highest etch rate regime. Thus generally, operations 203 and 207 are designed to etch approximately the same amount of material to maximize the etching at the initial high rate regime.

The pump down and further reaction operation may be repeated until sufficient amount of film has been reacted. In operation 209, a decision is made to repeat the pump down and reaction or to proceed. If sufficient amount of film has been reacted, then the solid reaction product is removed in operation 211.

In operation 211, the reaction product is decomposed and removed by sublimation and pumping/purging. The wafer may be moved from one processing station to another or stay in the same processing station. The sublimation may occur by increasing the AHFS film temperature to about 100° C. or above. Heat or other energy may be applied to the wafer or the AHFS directly to increase its temperature. For example, a temperature controlled pedestal may increase the wafer temperature by conduction and convection. Radiant energy may be applied to the wafer surface in the form of UV or infrared radiation. In some cases plasma or chemical energy may be used. In another cases, heated gases may be used.

After the solid reaction product is removed, the substrate is optionally cooled in operation 213. If needed, the cooling operation may occur in the same processing station, a different processing station, or a different chamber. In some embodiments, the cooling operation may occur in a cool down loadlock connected to the chamber directly or through a wafer transfer system (WTS).

FIGS. 4A to 4F depicts rough schematic cross-sectional diagrams of certain operations in a gap fill process for isolated features and dense arrays. Isolated features and dense arrays are often found on the same partially fabricated semiconductor device. Thus it is preferable that semiconductor fabrication methods work well with both kinds of features. A fabrication method optimized for challenging features such as very dense arrays with high-aspect ratio may not work well with isolated features, but should not damage them.

Operation 401 corresponds to a fill material deposition. In an isolated feature such as that depicted in FIG. 4A, the width at the bottom of a feature may be as wide or wider than the height of a sidewall of a feature. The underlying layer 411 may be a silicon substrate, a deposited silicon such as silicon-on-insulator (SOI), a silicon nitride (SiN) liner, or a layer of other dielectric material. On this underlying layer a layer of fill material 413 is deposited. Various processes to deposit a fill material may be used. Suitable deposition processes may include sub-atmospheric chemical vapor deposition (SACVD), plasma enhanced chemical vapor deposition (PECVD), chemical vapor deposition (CVD), atomic layer deposition (ALD), plasma enhanced atomic layer deposition (PEALD), pulsed deposition layer (PDL), spin-on deposition (SOD), or high density plasma chemical vapor deposition (HDP CVD). Depending on the process used, the film deposited may have different or uniform thickness at the bottom and on the sidewalls of an isolated feature.

Figure 4A:
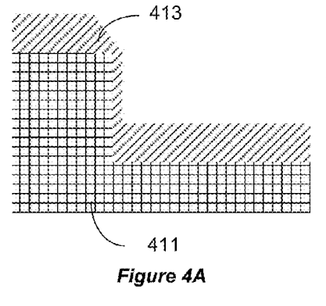
FIGS. 4A to 4F depicts rough schematic cross-sectional diagrams of certain operations in a gap fill process for isolated features and dense arrays.
Figure 4B:
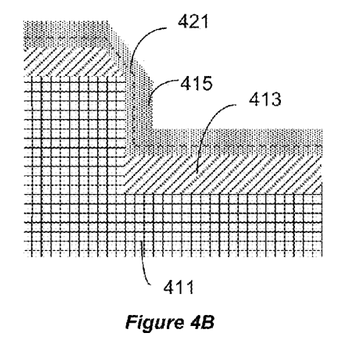
Figure 4C:
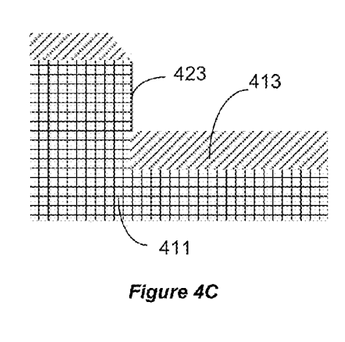
Figure 4D:
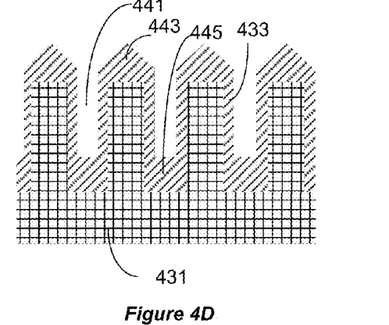

In a dense array such as that depicted in FIG. 4D, the width at the bottom of a feature may be as six or more times shorter than the height of a sidewall of a feature. In other words, the aspect-ratio may be about 6:1 or larger. A fill material 433, e.g., a dielectric material, is deposited on top of the underlying layer 431. To at least partially fill dense arrays, HDP CVD is often used. High density plasma is used to direct deposition material toward the bottom 445 of a feature, thereby fill the feature from the bottom-up. HDP CVD results in a thicker film on the bottom 445 than on the sidewalls. Due to the nature of the deposition process, there are both top hat formations 443 and cusps formed. Top hat formations refer to material deposited above the feature, adjacent to the gap opening. Top hat formations may, but do not necessarily, form part of an overhang structure that can partially block the opening. In the example shown in FIG. 4D, the top hats 443 do not form part of the overhang or cusp.

Cusps are regions on the sidewall in which there is a narrowing of the opening from a bottom-up perspective. Depending on the structure shape and the deposition methods, cusps may form around or just below the top surface. The cusps typically result from the non-directional deposition reactions of neutral species in the plasma reactor and from sputtering/redeposition processes. Limitations due to overhang formation become ever more severe as the width of the gap to be filled decreases, the aspect ratio increases, and the features become reentrant (i.e., the sidewalls of the feature taper inwardly at the bottom of the feature.) At some point, pinching off occurs, preventing further bottom deposition. Thus the top hats and cusps are reduced or removed before pinch-off occurs.

Atomic layer removal (ALR) may be used to remove unwanted deposition in a partially filled gap. In operation 403, a solid reaction product is formed by injecting the reactant gases. The reactant gases may be flowed into the processing station sequentially in either order or concurrently. The reactant gases may be added in a dose or in a continuous stream. In some embodiments, a first reactant gas is added, and while the first reactant gas continues to flow, a second reactant gas is added.

Figure 4E:
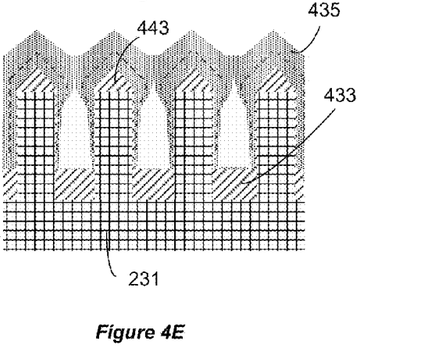

The solid reaction product (e.g., ammonium hexafluorosilicate or AHFS) has a higher specific volume than the fill material it consumes. In the isolated feature region as shown in FIG. 4B, equal amounts of material are etched from the surface and the bottom of the feature. Equal amounts of fill material 413 are reacted to form solid reaction products 415. The dotted line 421 indicates the amount of material before ALR. For dense array regions, the solid reaction product 435 can block and pinch off the opening. After the pinch off, the etchants do not penetrate to the bottom of the gap, thus allowing selective etching of the upper portion of the gaps. This is shown in FIG. 4E. Note that no significant etching occurs at the bottom of the gaps while the top hats 443 are significantly reduced.

Figure 4F:
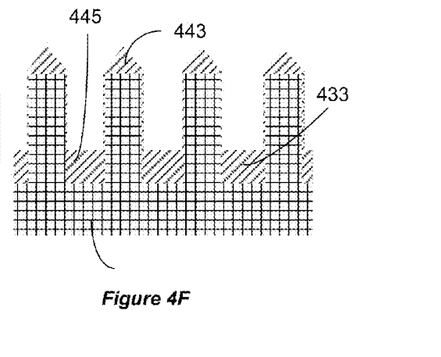

In operation 405, the reaction product is decomposed and removed by sublimation and pumping and/or purging. For the isolated features as shown at FIG. 4C, unreacted fill material 413 is exposed. Note that because less fill material is deposited on the sidewalls to begin with, the sidewalls 423 may become bereft of the fill material after ALR sublimation. Thus the isolated feature sidewall film thickness may limit how much material can be removed using ALR etch if the underlying layer 411 cannot be etched. For the dense array region as shown at FIG. 4F, the ALR etch has the net effect of decreasing the aspect ratio of the remaining gap. Unreacted fill material is exposed at the bottom of the gap, and portions of the fill material on the sidewalls and top hats are removed.

According to various embodiments of the present invention, a higher overall etch rate is achieved during the ALR etch back portion of the gap fill process. Because the deposition and etch processes are then repeated as necessary to fill the gap, the increased etch rate reduces the total gap fill time and increases throughput of the entire gap fill process.

Figure 5:
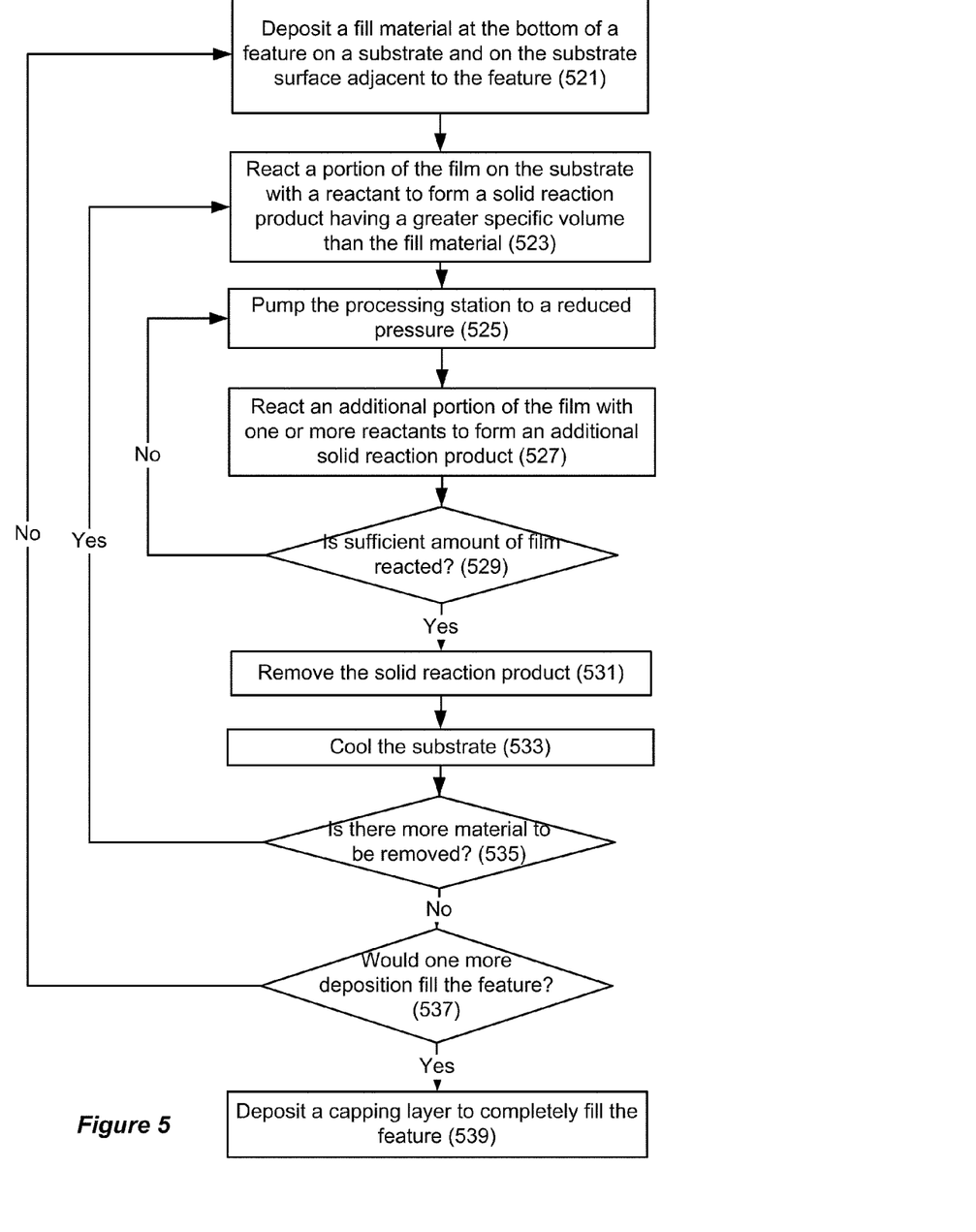
FIG. 5 is a process flow diagram depicting the operations for a multiple exposure with pump down ALR process in a gap fill context in accordance with various embodiments of the present invention.

FIG. 5 is a process flow diagram for gap fill incorporating the multiple exposure with pump down ALR. In operation 521, a fill material, e.g., silicon oxide, is deposited in a feature on a substrate and on the substrate surface adjacent to the feature. A portion of the film deposited is then etched to form a solid reaction product in a reacting operation 523. The process station is then pumped down to a reduced pressure from that of the reacting operation in operation 525 to reset the etch reaction rate. The one of more reactant gases are re-introduced to the film to react an additional portion of the film to form an additional solid reaction product in operation 527. If sufficient amount of film has reacted (operation 529) then the process proceeds to removing the solid reaction product in operation 531. If not, the pump down and further reaction operations 525 and 527 are repeated until a sufficient amount of film has reacted. The solid reaction product is removed by sublimation at an elevated temperature and pumping and/or purging away the vapor. Then the substrate may optionally be cooled in operation 533 down to a room temperature from the elevated temperature. In some circumstances, the multiple exposure with pump down ALR process may be repeated if even more material need to be removed (decision 535). This may occur because the pump down reset may become less effective the more it is repeated. Sublimation may be required then to completely remove the byproduct and expose remaining unreacted fill material. After the overhang and cusps are adequately removed, another layer is deposited. If one more deposition would fill the feature (decision 537), then a capping layer is deposited in operation 539. If not, then the process is repeated from operation 521 until the gap is filled.

Apparatus

Figure 6:
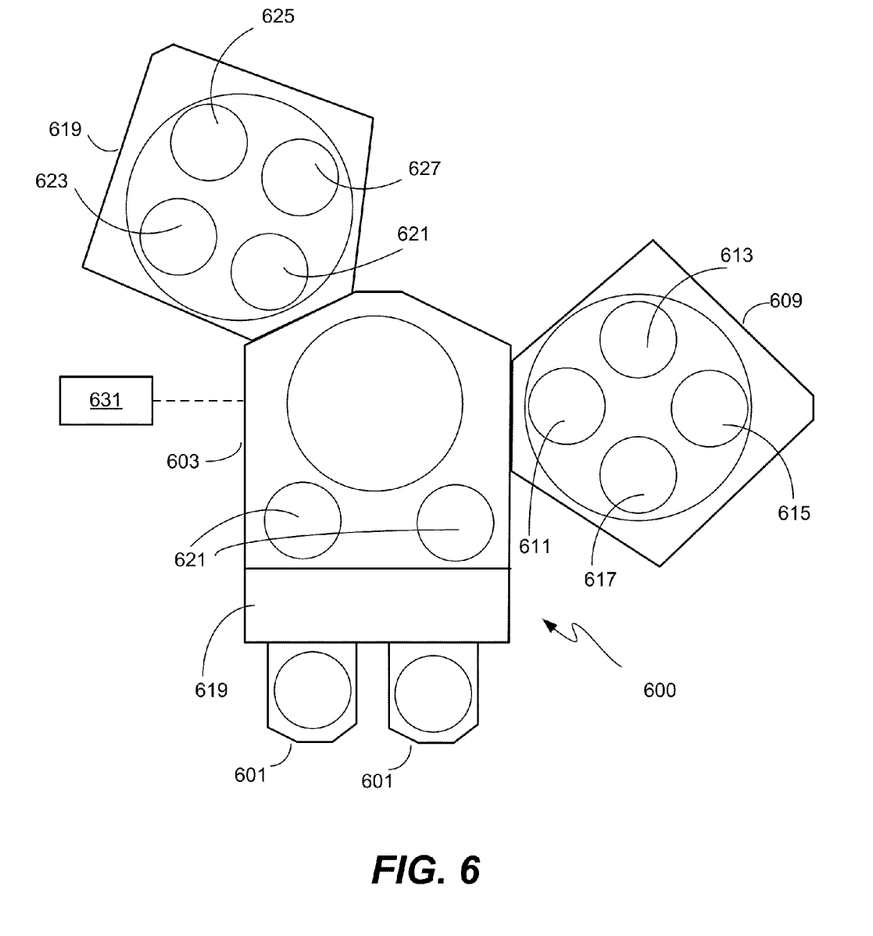
FIG. 6 is a block diagram of a plasma processing system suitable for conducting a gap fill process in accordance with the present invention.

In one embodiment, a single semiconductor processing tool may be configured to perform every operation of the method embodiment of the present invention. FIG. 6 shows an example of a semiconductor processing tool 600 with two ALR etch modules 609 and 619. ALR etch modules are multi-station chambers capable of performing the operations of the ALR etch method embodiment. Optionally, the system may also include one or more HDP CVD chambers/modules instead of an ALR etch module or in addition to those modules depicted in FIG. 6.

Partially fabricated semiconductor substrates enter the system 600 from cassettes at 601, or front-opening unified pods (FOUPs). The substrates are individually removed from the FOUP into the atmospheric chamber 619 by an atmospheric robot (not shown) to one of two load locks 621. After the load lock pressure is pumped down to that of the transfer chamber 603, a transfer chamber robot (not shown) transfers the substrate to an ALR etch module, 609 or 619. An optional process chamber module may be capable or be configured to perform HDP CVD fill material deposition and HDP plasma etch (optional). Instead of repeating an ALR etch operation as described in FIG. 5, one or more of the ALR etch operations may be replaced by an HDP plasma etch.

The ALR etch operations may be performed in a multi-station chamber such as chamber 609 of FIG. 6. The ALR etch module 609 may have two or more stations. As depicted, the module has 4 stations. Each station may perform the same operation or different operations. In one embodiment, the station 1 (611) delivers the ALR reactants to cause the reaction to form a solid reaction product. Station 2 (613) reduces the pressure to reset the reaction. Station 3 (615) could repeat the reactant exposure to cause further etching reaction. Station 4 (617) could removes the solid reaction product by decomposing, or subliming, the solid and removing the by-product gases. In other embodiments, station 1 (611) may perform the reacting, pump down, and the reacting operations. Station 2 (613) may perform the solid reaction product removal. Station 3 and 4 may repeat the processes of stations 1 and 2.

In still other embodiments, the process need not be entirely sequential. In a multiple station chamber environment, the wafers may experience similar processing at all stations sequentially. In some embodiments, the parallel and sequential processing may occur. For example, wafers A and B may be provided in parallel at stations 611 and 615 where the operations of reacting, pump down and then reacting operations are performed. Then these wafers may be transferred to other stations to remove the solid reaction product just as described above. Instead of proceeding to a third station, these wafers may be removed from the chamber. Thus each wafer experiences processing in only two stations of the four stations in the chamber.

In other embodiments, the wafer processing may occur on the same processing station in a single-station chamber/module or a multiple-station chamber. In these embodiments, the wafer would not be transferred from station to station for various operations. Instead, the entire reaction, pump down, reaction, and sublimation would all occur at the same processing station/module.

In still other embodiments, the wafer processing may occur in batch fashion where more than one wafer undergoes the same processing at the same processing station. In these embodiments, a special substrate holder, e.g., a multiple substrate holder, may be used.

The individual stations in multi-station chamber 609 may be micro-volume stations. A micro-volume station may have a volume less than 1 liter, preferably less than 500 milliliters. Using a micro-volume station reduces the amount of reactants used and saves material costs. In some embodiments, the individual stations may also have a clam-shell configuration such that the interior volume of the station may be isolated from that of the greater chamber 609. In still other embodiments, the individual stations may be separated by a gas curtain. Of course, other configurations to isolate the interior volume of the station may be used, as well as configurations where the stations are not isolated.

After the ALR etch operations in chamber 609, if no further deposition and etching is required, then the substrate is returned to loadlocks 621 before exiting the tool 600 via FOUPs 601. However, in some embodiments, after the ALR etch operations in chamber 609, the substrate is transferred to one of the optional HDP CVD chambers for fill material deposition. The ALR etch module 619 may be configured the same way as module 619 or in a different way. As described above, the modules may be configured differently depending on how many repetition of pump down and ALR reaction is required.

In another embodiment, the semiconductor processing tool may have several single station chambers or modules each dedicated to one operation or configured to perform all of the operations in sequence. For example, chamber 609 may be a single-station chamber/module that can be configured to perform the ALR etch operations.

The apparatus may also include a controller 631 configured to execute a set of instructions. The set of instructions may include instructions to inject one or more reactant gases into the first processing station at a first reaction pressure for a first reaction duration, reduce a station pressure to below that of the first reaction pressure for a pump-down duration, inject one or more reactant gases into a processing station at a second reaction pressure for a second reaction duration, heat the substrate to a sublimation temperature, and optionally cool the substrate. The set of instructions may also include instructions to perform typical HDP CVD deposition/etch steps. These instructions are to perform the operations in the method embodiment of the present invention using various chambers of the apparatus for different operations.

A suitable semiconductor processing tool may be C2 or C3 SPEED, Vector or ALTUS tool configured with one or more ALR etch modules, available from Novellus Systems, Inc. of San Jose, Calif. Another suitable semiconductor processing tool may be a SiCoNi tool available from Applied Materials, Inc. of Santa Clara, Calif. or a Certas tool available from Tokyo Electron Limited of Tokyo, Japan.

In still other embodiments, more than one semiconductor processing tool may be used to perform the operations of the method embodiment. For example, the fill material deposition may be performed in different tools from the ALR etch process.

Experimental Data

Tests were conducted to demonstrate the ability of a pump down operation between reacting operations to reset a first ALR reaction. ALR etch was conducted on four wafers with blanket film material deposited under the same process conditions. Each of the wafers was then ALR etched under the same flow rate, temperature, and pressure conditions for different durations. The initial reaction condition was 6 mTorr pressure, 26.5° C. wafer temperature, and HF flow rate of 60 sccm with $NH_3$ flow rate of 30 sccm. After the initial reaction, sublimation was performed on one wafer and that wafer was then reacted again. The sublimation duration was 30 seconds at an elevated temperature. Another wafer was subjected to a pump down between two reaction operations. The pump down was 30 seconds at a base pressure of 1 mTorr.

Figure 7:
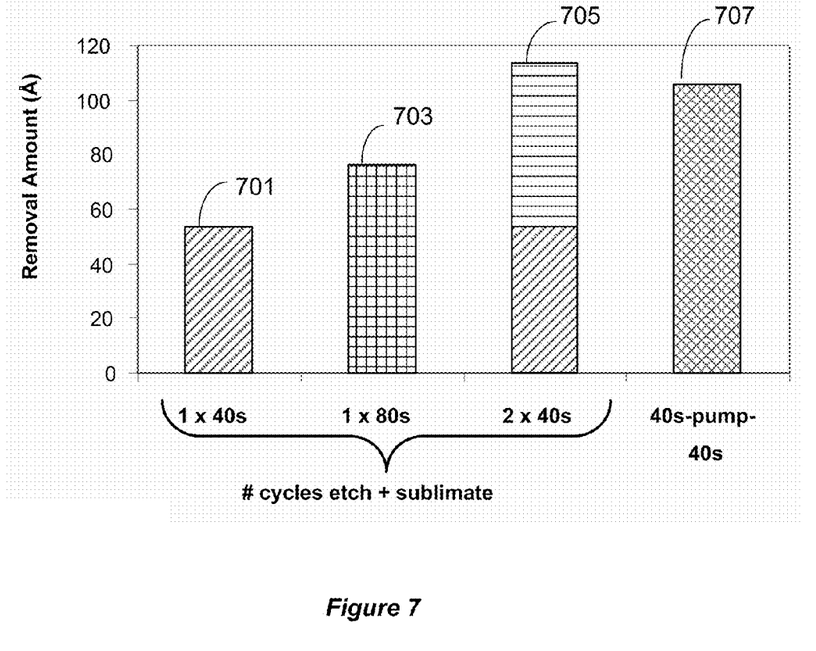
FIG. 7 is a bar graph comparing the amount of material etched using different ALR methods.

Single cycle ALR with a typical reaction operation time was performed on wafer 701. The reaction operation was 40 seconds. The total etch time was about 100 seconds, including wafer handling time, but not cool down time after the sublimation. About 55 Ångströms of material was removed.

Extended single cycle ALR was performed wafer 703. The reaction operation was 80 seconds. The total etch time was about 140 seconds, including wafer handling time, but not cool down time after the sublimation. About 80 Ångströms of material was removed. The increase in amount of material reacted in this extended single cycle ALR is consistent with the observation that the reaction slows with increasing reaction time. Thus, doubling the reaction time does not result in twice as much material being removed.

For wafer 705, the reaction/sublimation cycle was repeated in a multiple cycle ALR procedure. Two cycles of ALR etch each having a 40 second reaction time were performed. The duration of the sublimation operation was increased since the wafer was cooled before another reacting operation was performed. The total etch time was about 230 seconds to etch about 115 Ångströms. This etch rate of this multiple cycle ALR is higher than that of the extended single cycle ALR because the etch reaction rate becomes very slow as the ALR reaction saturates.

For wafer 707, the reaction operation was repeated with a pump down operation between the first and second reaction operations. Because the pump down operation does not involve a change in wafer temperature or moving the wafer (time in wafer handling), the total etch time was only about 170 seconds. About 105 Ångströms of material was etched, resulting in highest overall etch rate relative to the extended single cycle ALR and multiple cycle ALR. The amount etched for wafer 707 also demonstrated that the reaction rate at least partially resets after a pump down operation, because the amount reacted was much higher than that from a single 80 second etch reaction.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein.

What is claimed is:

1. A method comprising:
   (a) providing a substrate in a first processing station;
   (b) reacting a film on the substrate with one or more reactants to form a solid reaction product, the solid reaction product having a greater specific volume than the film consumed to form the solid reaction product;
   (c) reducing a pressure in the first processing station;
   (d) reacting the film with the one or more reactants to form additional solid reaction product while substantially all the solid reaction product of operation (b) remains on the substrate; and
   (e) removing the solid reaction product, wherein a reduced pressure in operation (c) is maintained for a period less than or equal to a duration of operation (e).

2. The method of claim 1, further comprising transferring the substrate to a second processing station after operation (d).

3. The method of claim 1, further comprising repeating operations (c) and (d).

4. The method claim 1, further comprising repeating operations (b) though (e).

5. The method of claim 1, wherein removing the solid reaction product comprises sublimating the solid reaction product at an elevated substrate temperature.

6. The method of claim 1, wherein the one or more reactants comprise a fluorine source and a nitrogen source.

7. The method of claim 6, wherein the nitrogen source comprises one or more of ammonia ($NH_3$) and atomic nitrogen ($N^*$).

8. The method of claim 6, wherein the fluorine source comprises at least one of hydrogen fluoride (HF), fluorine ($F_2$), nitrogen trifluoride ($NF_3$), atomic fluorine ($F^*$), ammonium fluoride ($NH_4F$), and ammonium bifluoride ($NH_4F$:HF).

9. The method of claim 6, wherein the fluorine source is hydrogen fluoride and the nitrogen source is ammonia, and wherein a flow rate ratio of hydrogen fluoride to ammonia is about 1 to 1 to about 3 to 1.

10. The method of claim 1, wherein during operation (b), a reactant partial pressure is about 1 mTorr to about 100 mTorr.

11. The method of claim 1, wherein operation (b) is performed at a first processing station pressure and operation (d) is performed at a second processing station pressure.

12. The method of claim 1, wherein operation (b) is performed at a first processing station pressure and operation (d) is performed at the first processing station pressure.

13. The method of claim 1, further comprising flowing an inert gas during at least one of operations (b), (c), (d), or (e).

14. The method of claim 13, wherein the inert gas is heated to a temperature above 25° C.

15. The method of claim 1, wherein the pressure in operation (c) is reduced to between about 0.01 mTorr and about 50 mTorr.

16. The method of claim 1, wherein the pressure in operation (c) is reduced to less than about 10 mTorr.

17. The method of claim 1, wherein a reduced pressure in operation (c) is maintained for a period of between about 1 second and 60 seconds.

* * * * *